United States Patent [19]
Bennett et al.

[11] Patent Number: 4,900,591
[45] Date of Patent: Feb. 13, 1990

[54] METHOD FOR THE DEPOSITION OF HIGH QUALITY SILICON DIOXIDE AT LOW TEMPERATURE

[75] Inventors: Brian R. Bennett, Redford; Joseph P. Lorenzo, Stow; Kenneth Vaccaro, Medford, all of Mass.

[73] Assignee: The United States of America as represented by the Secretary of the Air Force, Washington, D.C.

[21] Appl. No.: 146,072

[22] Filed: Jan. 20, 1988

[51] Int. Cl.$^4$ ............................................. C23C 16/40
[52] U.S. Cl. .................................. 427/255; 427/255.3
[58] Field of Search .................. 427/255, 255.3, 99

[56] References Cited

U.S. PATENT DOCUMENTS

| | | | |
|---|---|---|---|
| 3,892,891 | 7/1975 | Goodman et al. | 427/255 |
| 4,196,232 | 4/1980 | Schnable | 427/255.3 |
| 4,223,048 | 9/1980 | Engle | 427/255.3 |
| 4,232,063 | 11/1980 | Rosler et al. | 427/255.3 |
| 4,239,811 | 12/1980 | Kemlage | 427/255.3 |
| 4,252,580 | 2/1981 | Messick | 148/175 |
| 4,339,471 | 7/1982 | Kaganowicz et al. | 427/255.3 |
| 4,371,587 | 2/1983 | Peters | 427/255.3 |
| 4,396,437 | 8/1983 | Kwok et al. | 148/1.5 |
| 4,483,725 | 11/1984 | Chang | 148/175 |
| 4,500,388 | 2/1985 | Ohmura et al. | 156/603 |
| 4,547,230 | 10/1985 | Hawrlyo | 148/171 |
| 4,624,859 | 11/1986 | Akira et al. | 427/255 |
| 4,634,605 | 1/1987 | Wiesmann | 427/255.3 |
| 4,686,112 | 8/1987 | Hoffman | 427/255.3 |

Primary Examiner—Sadie Childs
Attorney, Agent, or Firm—Jules J. Morris; Donald J. Singer

[57] ABSTRACT

The invention comprises a pyrolytic process for the deposition of high quality silicon dioxide at temperatures of 100°–330° C. Deposition is achieved by reacting silane and oxygen in the 2–12 torr pressure range, yielding deposition rates of 140 Å/min at 300° C. and 50 Å/min at 120° C. Measurements of refractive index (1.45–1.46), field strength ($3-10 \times 10^6$ V/cm), and resistivity ($10^{13}$–$10^{15}$ -cm) indicate that the oxides are near stoichiometric SiO$_2$. This technology appears promising the Group IV and Group III-V device applications.

20 Claims, 5 Drawing Sheets

METHOD FOR THE DEPOSITION OF HIGH QUALITY SILICON DIOXIDE AT LOW TEMPERATURE

This invention relates to techniques for depositing dielectric material on semiconductor material. It is particularly related to low temperature chemical vapor deposition of silicon dioxide on indium phosphide and other semiconductor substrates.

BACKGROUND OF THE INVENTION

Development of compound semiconductor integrated technologies particularly in the solid state optics field have resulted in a need for high quality dielectrics and compound interfaces. This requirement is especially important for indium phosphide devices because indium phosphide and its alloy systems are well established as a base for discrete optical devices.

Recently the potential for high speed and high power indium phosphide devices has been demonstrated. The inherent material properties of indium phosphide, such as high electron peak and saturation velocity, low ionization rate, and high thermal conductivity, lead to higher frequency operation at higher powers than gallium arsenide devices. Furthermore, the surface potential of indium phosphide can be modulated over a substantial portion of the band gap, making the indium phosphide metal-insulated-semiconductor field effect transistor (MISFET) a viable device. Several research groups have now successfully fabricated indium phosphide MISFETs with high frequency and high power characteristics.

The requirement for high quality, low temperature dielectrics for applications in both group IV and group III-V semiconductor devices is particularly acute for indium phosphide devices because phosphorous begins to disassociate from the indium phosphide crystal at temperatures of 250° to 300° C. resulting in device deterioration. Further, high process temperatures can result in the interdiffusion of deposits and excessive penetration of metal alloys.

Unlike silicon, indium phosphide is not blessed with a good native dielectric. Although research is continuing on the controlled growth of native oxides for MIS structures, the techniques that have proven most successful thus far involve the deposition of foreign dielectrics such as $Al_2O_3$, $Si_3N_4$, and $SiO_2$ on indium phosphide. These deposition processes however are constrained by the high vapor pressure of phosphorous, resulting in the above-mentioned disassociation. Deposition of $SiO_2$, has been achieved by conventional plasma and photo enhanced reactions. However, the thermal nonequilibrium nature of these reactions make deposition of dense, uniform, stoichiometric $SiO_2$ difficult to achieve. Thus deposition of these dielectrics by conventional means, has not so far allowed for the consistent production of high quality devices.

The most common approach for group III-V material is, therefore, to exploit various chemical vapor deposition (CVD) techniques based in silicon. These CVD techniques are used to deposit oxides and nitrides on a variety of substrates but the typical processes require temperatures of 400 to 1200 degrees C. While these temperatures pose few problems for purely silicon application they are unacceptable for most group III-V devices and some silicon processes.

A need therefore exists for a method of providing a high quality, low temperature dielectric for application in both group IV and III-V semiconductor devices. A further need exists for a low temperature dielectric deposition process that is capable of providing uniform and dense stoichiometric $SiO_2$ layers on a variety of substrates without inducing substrate disassociation or interdiffusion.

SUMMARY OF THE INVENTION

The invention comprises a new long pressure and low temperature pyrolytic process for the chemical vapor deposition (CVD) of silicon dioxide. The process differs from conventional low pressure CVD in that lower tempeatures (80°–330° C.) and a unique pressure window (2–10 torr) provide the conditions for the reaction of silane and oxygen and the deposition of high quality $SiO_2$. In this purely thermal process, activation energies of 0.15 to 0.18eV and deposition rates of up to 140 angstroms/min at 250° C. are achieved. This technique is approximately 15 times less sensitive to the oxygen to silane ratio than atmospheric pressure CVD. These deposition conditions are compatible with both low temperature silicon devices and III-V technologies.

In a preferred embodiment of the invention, the method of depositing silicon dioxide on a substrate comprises the steps of placing the substrate in a reaction chamber and heating it to between 80° and 330° C. The reaction chamber is evacuated to between 2 and 12 torr. The substrate is then subjected to a substantially non-excited gas flow mixture comprising silicon and oxygen bearing compounds in order to deposit a silicon dioxide layer upon the substrate. (In a preferred embodiment of the invention).

In the preferred embodiment of the invention, the substrate may comprise silicon, indium phosphide, galium arsenide or germanium. Although the preferred silicon bearing gaseous compound is silane, other silicon bearing compounds may be used. Among them are disilane, silicon tetrachloride, hexachlorodisilane, tetrathoxysilane, tetramethylcyclotetrasiloxane and dichlorosilane.

In a particularly preferred embodiment of the invention, the gaseous oxygen bearing compound can be selected from oxygen, niterous oxide, nitric oxide, nitrogen dioxide, carbon dioxide, ozone and other oxygen bearing gases.

In the preferred emobidiment of the invention the substrate comprises indium phosphide which is subjected to a gas flow comprising three percent silane in helium. In this embodiment the reaction chamber is preferably evacuated to about 3 torr.

An object of the invention therefore is to provide a method of depositing dielectrics at low temperature on a variety of substrates.

An advantage of the invention is the ability to produce high quality dielectric layers without harming substrate crystal structure. A further advantage of this invention is that the dielectric layer produced by this method can be used for a variety of device applications including passivation, isolation, capping and gate dielectrics for metal-insulator-semiconductor field effect transistors.

A further object of this invention is to provide a dielectric deposition process that is substantially pyrolytic and avoids the use of energetic processes that can damage fragile semiconductor surfaces and device structures through the action of energetic ions.

BRIEF DESCRIPTION OF THE DRAWINGS

The foregoing and other objects and advantages of the invention will be apparent from the following more particular description of the preferred embodiments of the invention, as illustrated in the accompanying drawings, in which like reference characters refer to the same parts throughout the different views. The drawings are not necessarily to scale, emphasis instead being placed upon illustrating the principles of the invention.

DETAILED DESCRIPTION OF THE INVENTION

The invention comprises a new pyrolytic process for the deposition of high quality silicon dioxide using chemical vapor deposition at low pressures and low temperatures. Low pressure chemical vapor deposition (LPCVD) of silicon dioxide was first reported in 1968 has become a common industrial process with standard deposition parameters of 0.5-1.0 torr and 500°-700° C. The oxides are of generally high quality, but no silicon dioxide deposits have been obtained at these pressures below 450° C. The process of this invention differs from the standard LPCVD in that it uses pressures of 2 to 12 torr and temperatures of 80° to 330° C. It also differs from conventional low temperature techniques in that only thermal energy is used and the gases are not energized through photo-enhancement of plasmas.

Figure 1:
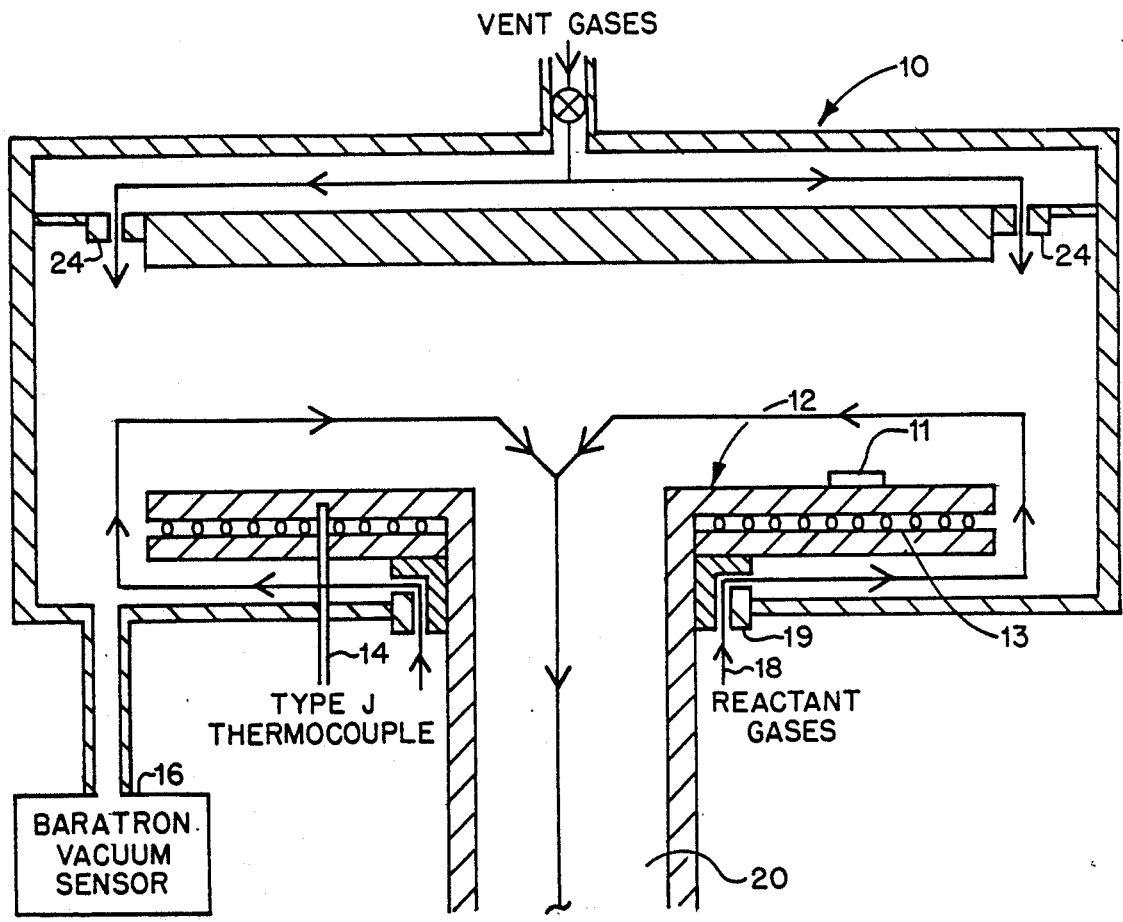
FIG. 1 is a schematic representation of a deposition chamber suitable for use with the method of this invention.

Referring now to FIG. 1, a radial-flow, flat-bed plasma chamber 10 was used for all depositions. The plasma, however, was not activated and all reactions were strictly pyrolytic. Samples 11 were placed on a circular, heated, aluminum platen 12. A conventional heater 13 was used to heat the platen 12 and a type-J thermocouple 14 was placed in contact with the platen to measure temperature. Pressure was measured by a Baratron capacitance probe 16 and was held constant by an exhaust control valve located in the exit port 20 between the chamber 10 and a vacuum pump. The gas flow system consists of three input lines, each with a solenoid valve and a mass flow controller. Gas flows were set at the desired level (up to 20 sccm), and the gases were mixed before entering the chamber 10. Gas mixtures 18 enter below the platen 12 at orifice 19 and flow radially over the heated samples and platen towards a central exit port 20. The deposition gases were electronic grade oxygen and 3 percent silane in helium. The base plate and chamber cover were cooled by chilled water.

The chamber was heated under vacuum, then vented through vents 24 with dry nitrogen for sample loading. A base pressure of less than 50 microns was attained prior to the deposition cycle. Chamber pressure and temperature were usually stabilized at the below discussed preferred pressures and temperatures after 1 minute of gas flow. The deposition rate generally began to decline after 2 microns of silica coated the chamber. These deposits were periodically removed with a $CF_4/O_2$ plasma.

Using this apparatus we have deposited silicon dioxide on silicon, germanium, gallium arsenide, and indium phosphide with no significant differences in deposition rate or refractive index. This was attributed to the fact that once a thin layer of silicon dioxide is deposited, the reacting gases contact only the oxide and not the underlying substrate. Most of the depositions reported below used n-and p-type silicon. Silicon dioxide thickness was measured with an automated ellipsometer using a helium-neon laser. Bulk optical constants of each substrate batch were measured and used in the calculation of film thickness and refractive index.

The process variable included temperature, pressure, oxygen-to-silane ratio, carrier-to-silane ratio, total gas flow, gas velocity, and sample position on the platen. The system has been characterized as a function of these parameters, and conditions were established for reasonable deposition rates and uniformity.

Figure 2:
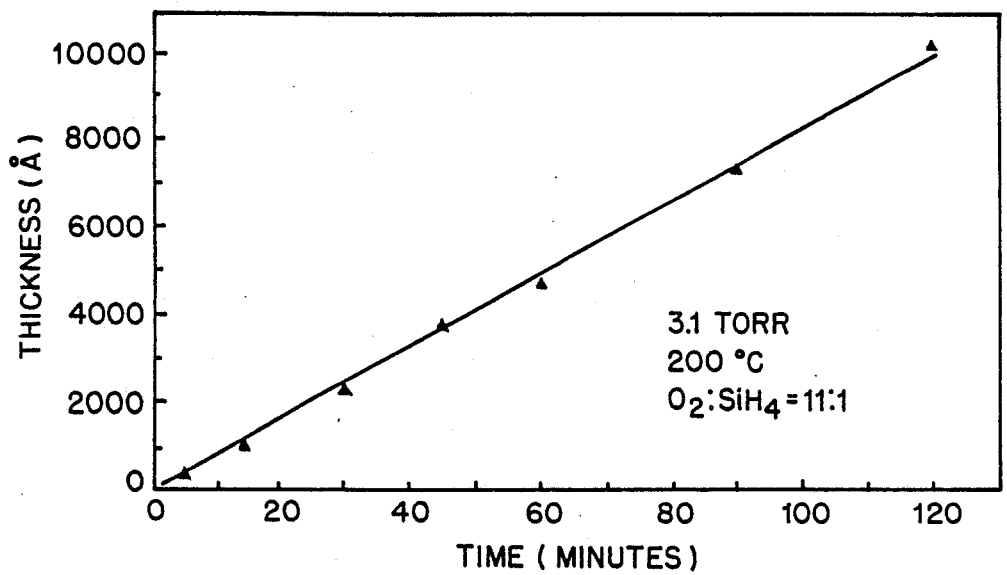
FIG. 2 is a graph showing silicon dioxide thickness plotted as a function of time for a constant set of deposition conditions.

FIG. 2 is a graph showing silicon dioxide thickness plotted as a function of time for a constant set of deposition conditions. This gas flow rate for 3 percent silane was set at 99 sccm and for oxygen at 33 sccm. The chamber pressure was 3.1 torr, temperature was 200° C. and the oxygen to silane ratio was 11 to 1. The graph shows that film thickness was a linear function of time with a constant deposition rate of 85-90 angstroms per minute. Most of the subsequent depositions reported herein were limited to 15 minutes.

Figure 3:
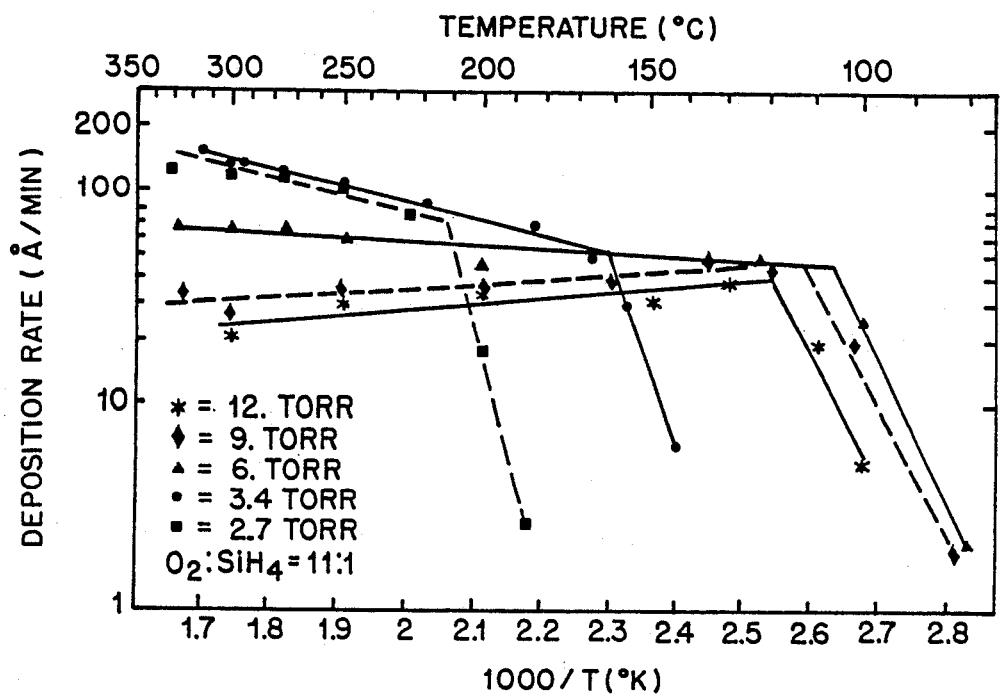
FIG. 3 is a graph showing the deposition rate of silicon dioxide as a function of inverse temperature at fixed pressures.

FIG. 3 shows the variation in deposition rate with inverse temperature at five fixed pressures. Once again, the gas flow rate for 3 percent silane was set at 99 sccm and for oxygen at 33 sccm. For each pressure, there are two distinct regimes: a low temperataure region, in which the deposition rate is a strong function of temperature, and a high temperature region, in which the rate is much less sensitive to temperature. The slope in the strongly dependent region appears to be constant for all pressures, indicating a reaction-limited process. In the higher temperature region, the slope and the range over which it extends varies considerably with pressure, suggesting a diffusion-limited process. Assuming an energy barrier must be overcome for reaction to occur, an activation energy, $E_a$ can be estimated using the equation $$\text{rate} = C \cdot \exp(-E_a/kt)$$

The calculated activation energies for the low temperature regions are 1-2 electron volts per molecule (25-50 kcal/mol) for all five pressures. Activation energy, $E_a$ drops to 0.1-0.2 eV in the higher temperature regions for 2.7, 3.1 (not shown), and 3.4 torr. These values again suggest that the silicon dioxide deposition is reaction limited for lower temperatures and diffusion limited for higher temperatures. The energy barrier model is therefore correct for lower temperatures; the cracking of silane is believed to be the energy barrier. At higher temperatures, the gases have sufficient energy to react and the rate is limited by the transport of reactants to the surface. Gas diffusion coefficients are generally proportional to $T^\beta$ where T is absolute temperature and $\beta$ is between 1.5 and 2. Such a temperature dependence would result in the small slopes observed. The transition from kinetic to diffusion limited deposition shifts to lower temperatures as the pressure increased. For example, at 6 and 9 torr the deposition rate is about 50 angstroms per minute at 120° C., but at 2.7 torr no deposition is observed below 200° C.

In the higher temperature regions at 9 and 12 torr the deposition rate increases with increasing temperature. Such data seems anomalous until the geometry of the deposition system is considered. The sample 11 (FIG. 1) position was fixed at 9–10 cm from the platen outer edge for all the data collected for FIG. 3.

Figure 4:
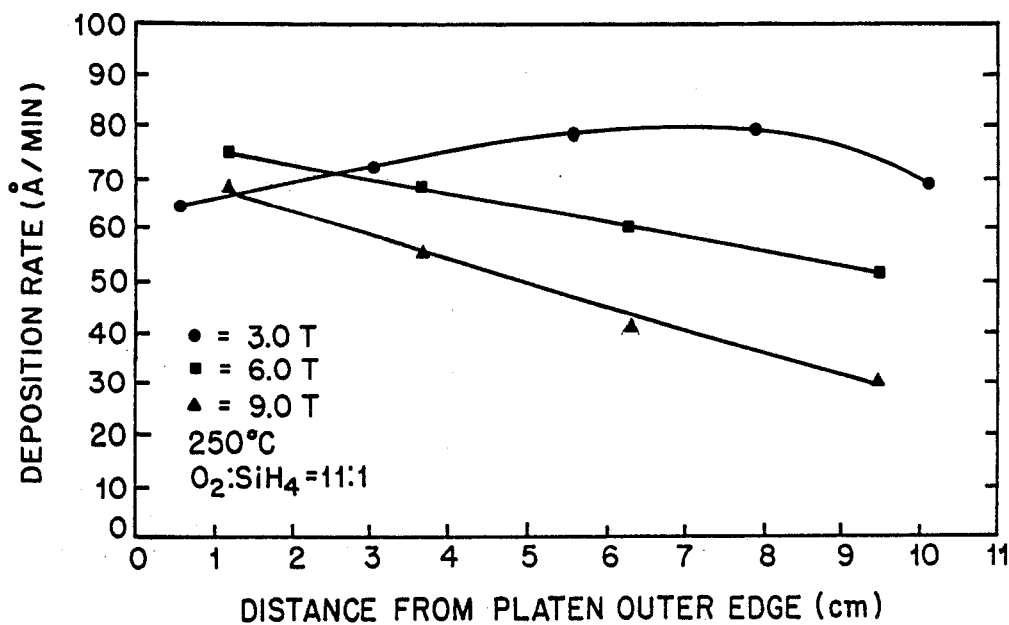
FIG. 4 is a graph showing the variation of $SiO_2$ deposition rate with radial position for 3 percent $SiH_4$ at 99 sccm and $O_2$ at 33 sccm.

FIG. 4 shows the deposition rate as a function of sample radial position for 3, 6 and 9 torr. At 3 torr, the deposition rate varies by 10 percent with radial position, but by 9 torr the rate of the platen edge is nearly twice the rate of the center. That is, for high temperatures and pressures (consider the 120°–330° C., 9 torr data in FIG. 3) more silane and oxygen react before reaching the sample, resulting in an apparent decrease in deposition rate with temperature. FIG. 4 shows that the 9 torr deposition rate is less than the 6 torr rate at all positions. Similarly, the 12 torr rate (not shown) was less than the 9 torr rate for all radial positions. FIG. 3 shows that the 12 torr rate is also less than the 9 torr rate at all temperatures. These data show that reasonable deposition rates may be possible at even higher pressures, at least not at this oxygen to silane ratio (11:1).

Figure 5:
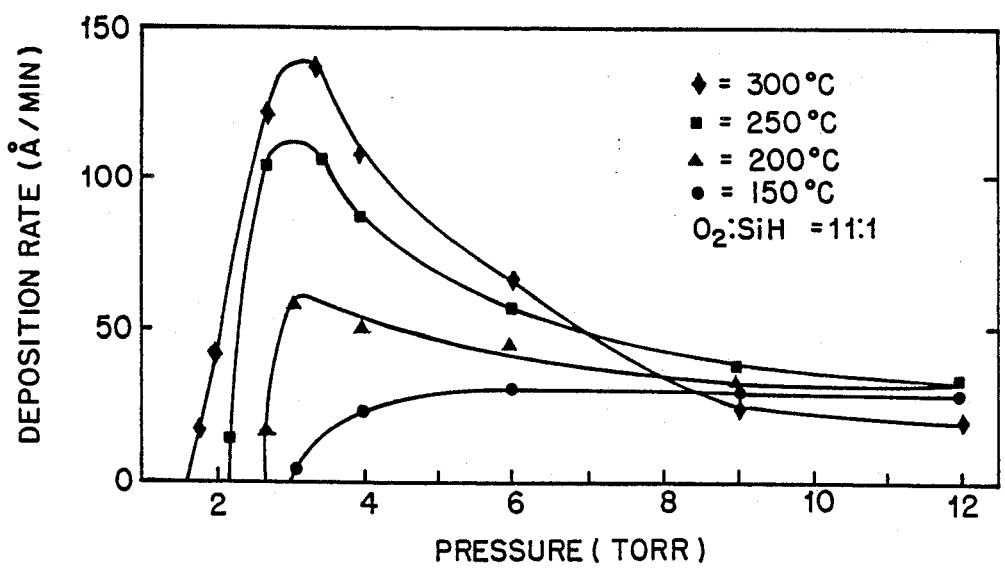
FIG. 5 is a graph showing $SiO_2$ deposition rate versus total pressure.

FIG. 5 is a plot of the deposition rate as a function of pressure for four fixed temperatures. No deposition is observed below 1.8 torr. This is consistent with the fact that higher temperatures (ie. greater than 450° C.) are required for conventional low pressure CVD at 0.5–1.0 torr. As the temperature increases, the maximum pressure required for deposition decreases. A maximum deposition rate of 140 angstroms per minute occurs at 3.0 torr and 300° C. At each temperature the depositon rate peaks and then declines as the pressure is increased; this decline can be attributed to a combination of the nonuniform radial deposition at higher pressures and the retardation caused by excess oxygen as discussed below.

Figure 6:
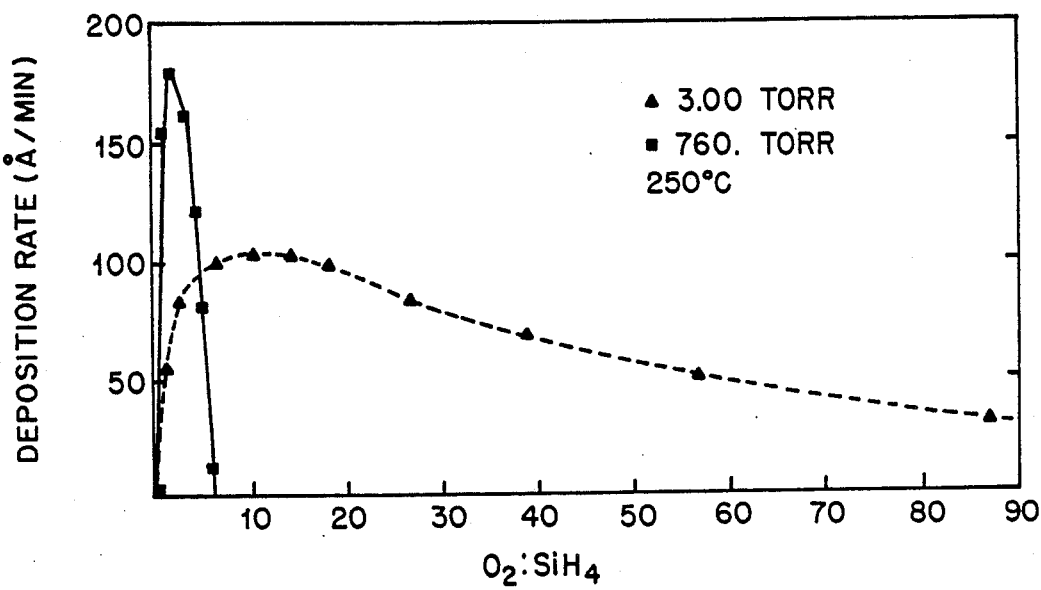
FIG. 6 is graph showing the silicon dioxide deposition rate as a function of the oxygen-to-silane ratio at atmospheric pressure and 3.0 torr.

FIG. 6 shows the silicon dioxide deposition rate vs the oxygen-to-silane ratio. The total flow and pressure were held constant at a 108 sccm and 3.0 torr while the oxygen to silane ratio was varied. For comparison reference published data at 760 torr is also plotted. Both data sets were taken at 250° C. The contrast between curves demonstrates one of the advantages of the process of this invention. At atmospheric pressure there is a sharp peak as oxygen-to-silane equals 2:1 and no deposition for oxygen-to-silane ratio greater than 7:1. In contrast, according to the method of this invention, silicon dioxide deposition has been achieved at oxygen-to-silane ratios as great as 88:1 when they are conducted at 3.0 torr. The deposition rate of this invention is nearly constant at 100 Å/min from the 7:1 to 20:1 ratios. For reproducible deposition, a preferred operating ratio is 14:1. At this ratio, problems, such as incorrect mass flow rate, calibrations or fluctuations in flow rates caused by silica particles in gas lines and valves, will not significantly alter the deposition rate. An advantage of operating at large oxygen-to-silane ratios is that more dilute silane mixtures can be used, avoiding the health hazards of pyrophoric mixtures (greater than 5 percent silane). An additional advantage of operating at the 2–12 torr pressure regime is that the ability to operate over a wide range of oxygen-to-silane ratios allows more flexibility in controlling oxide properties. For example, it has been published that fixed oxide charge density for silicon dioxide deposited at atmospheric pressure (760 torr) was a function of the oxygen-to-silane ratio, with a 6:1 ratio yielding the lowest charge density. This ratio limits the growth rate of the silicon dioxide to about 10 Å/min.

Oxygen's sticking coefficients on silicon and silicon dioxide are much higher than silane's. It is therefore believed that the dominant mechanism for silicon dioxide deposition is the absorption of oxygen and its subsequent reaction with silane. At high oxygen concentrations the oxygen covers most of the substrate surface, limiting the rate of absorption of silane and thus retarding growth. This explains the reduction in deposition rate at atmospheric pressure for oxygen-to-silane ratios greater than 2. According to the method of this invention, which operates at lower pressures, it is thought that we have reduced oxygen absorption on the substrate while satisfying the thermodynamic conditions necessary for pyrolytic CVD, consequently broadening the oxygen-to-silane ratio curve.

Figure 7:
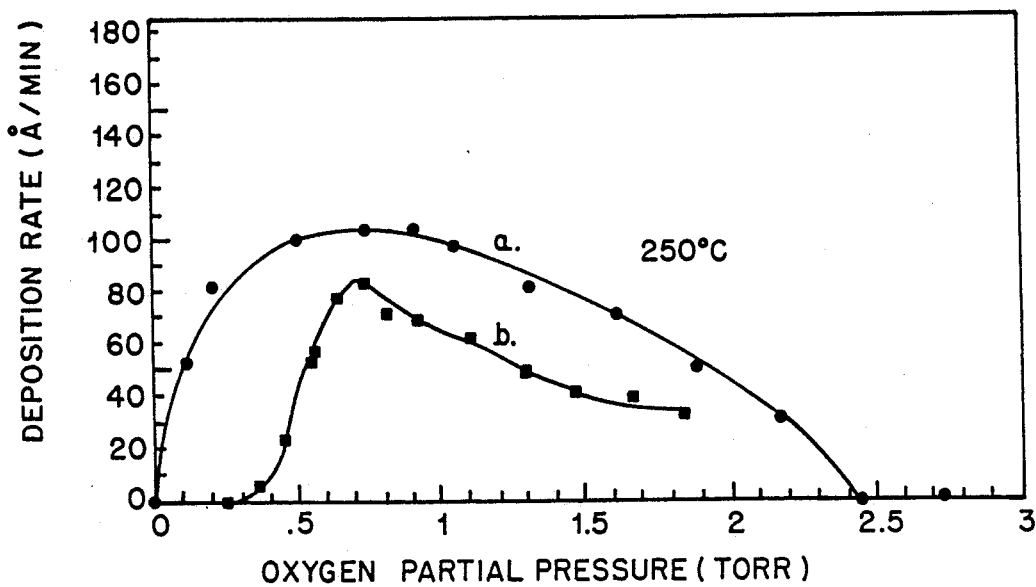
FIG. 7 is a graph showing $SiO_2$ deposition rate vs. $O_2$ partial pressure where as (a) total pressure constant at 3.0 torr and (b) $O_2$:$SiH_4$ constant at 8:1.

The retardation effect can also be considered in terms of oxygen partial pressure. The 3 torr data was converted from FIG. 6 into deposition rate vs. $O_2$ partial pressure and plotted in FIG. 7 with a data set obtain by holding the $O_2$:$SiH_4$ ratio constant at 8:1 and varying the total pressure. Although the curves are not identical, both peak near and oxygen partial pressure of 0.75 torr, suggesting that oxygen partial pressure may be a more fundamental parameter than $O_2$:$SiH_4$ ratio. The deposition rate for the fixed total pressure (3.0 torr) curve (FIG. 7a) drops to zero beyond an $O_2$ partial pressure of 2.4 torr, probably due to an absence of silane, not just a high oxygen partial pressure. The fixed $O_2$:$SiH_4$ (8:1) curve (FIG. 7b) drops to zero for $O_2$ partial pressure less than 0.3 torr because of a low total pressure.

Figure 8:
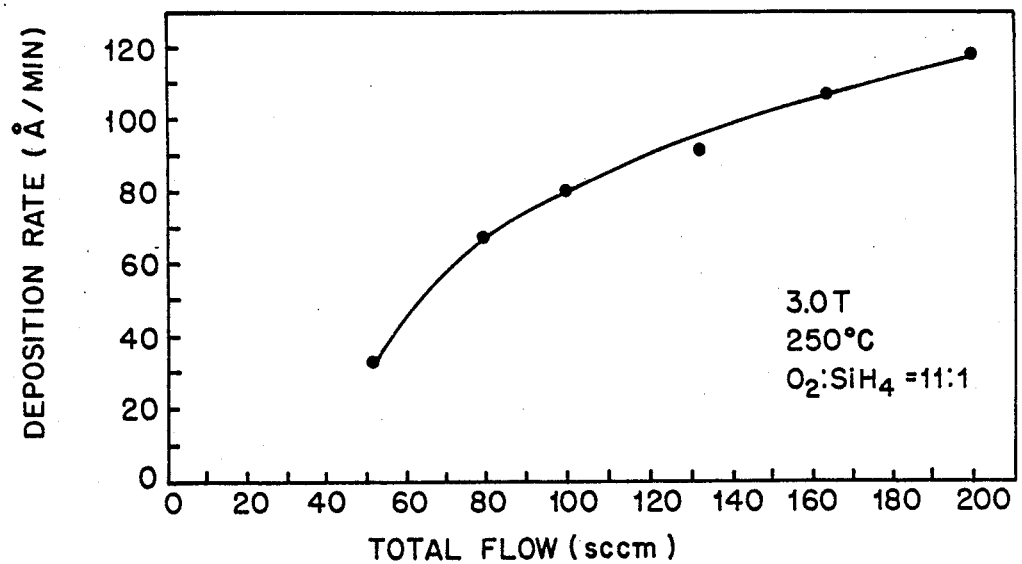
FIG. 8 is a graph of $SiO_2$ deposition rate vs. total gas flow.

FIG. 8 shows constant temperature, pressure and gas ratios and varied total gas flow. As the total flow was increased, the exhaust valve was opened wider to allow a higher pumping speed and maintain a constant pressure. Increasing gas flow with constant pressure results in higher gas velocity through the chamber. The decrease in the time each gas molecule spends in the chamber might be thought to cause a decrease in the deposition rate because the gas has less time to heat and react; however, more gas is going through the chamber and passing over the substrate which increases the number of molecules available for reaction. The data indicate that the latter effect is dominant, although doubling the flow rate increases the deposition rate by less than a factor of two, suggesting some combination of these effects. Oxygen retardation may also play a role here.

Figure 9:
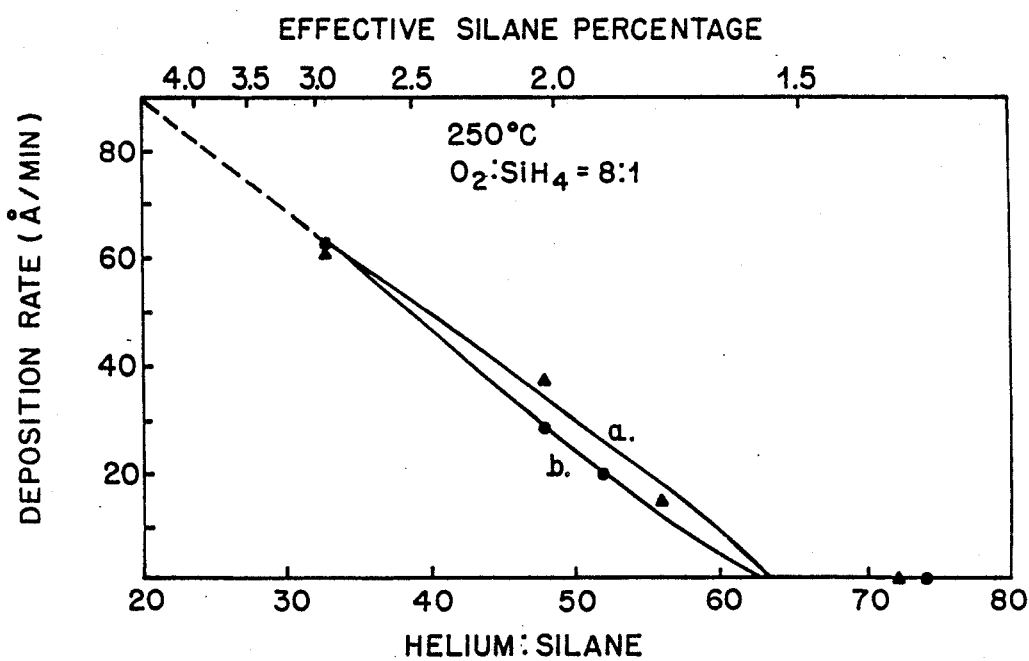
FIG. 9 is a graph of $SiO_2$ deposition rate vs. helium-to-silane ratio where (a) as 3 percent $SiH_4$ and $O_2$ flows constant (81 and 18 sccm) (b) is total gas flow constant (99 sccm).

Another important parameter is the carrier-to-silane or carrier-to-oxygen ratio, equivalently, the mole fractions os silane and oxygen. Deposition is expected to decrease as the silane and oxygen become more dilute. For FIG. 9, curve a, flows were held constant at 81 sccm for 3 percent SiH$_4$ in He and 18 sccm for O$_2$. Varying amounts of helium were added. The deposition rate drops off sharply as the He:SiH$_4$ ratio is increased. This decrease from 60 Å/min at 33:1 to less than 5 Å/min at 66:1 is equivalent to changing from a tank of 3 percent to 1.5 percent silane. Curve 9b shows a similar change in deposition rate with He:SiH$_4$ ratio for constant total flow. The deposition is suppressed slightly more than in curve 9a due to the lower total flow.

The deposition rates for this process are high enough for most purposes and can easily be reduced for applications such as thin gate oxides in submicron devices. In addition to reasonable rates, good electrical and mechanical properties and uniformity are required for device applications. Oxide thickness across a 1 inch water (250° C., 3.0 torr) varies about 4 percent. Such uniformity is adequate for many device applications. At higher pressures (6-12 torr), uniformity suffers, but it may be improved by adjusting gas flow or ratios, or by design changes in the chamber geometry.

The oxide refractive indexes (measured at half-period) were 1.45-1.46; the value for thermal silicon dioxide is 1.46. Refractive index (n) is a function of both composition and density. For comparison, the value of silicon,oxide is 1.97. As the density of pure silicon dioxide varies from 2 to 2.2 g/cm$^3$, n increases from 1.42 to 1.46. We have independently calculated the density by etching off a portion of an oxide and measuring the change in mass with a microgram balance. The result was 2.23±0.07 g/cm$^3$ for a 250° C., 3.0 torr oxide.

The oxides have also been characterized by current vs voltage measurements. These gave estimates of silicon dioxide field strength and resistivity. The breakdown voltages were generally in the range of 3-10×10$^6$ V/cm, for deposition conditions ranging from 330° C. and 3.0 torr to 120 degrees C and 9.0 torr. The resistivities varied from 10$^{13}$ to 10$^{16}$ ohm-cm. Typical values for high temperature thermal oxides are E$_{Br}$ =5-10×10$^6$ V/cm and resistivity equaling 10$^{14}$-10$^{16}$ ohm-cm.

The refractive index, density, field strength, and resistivity of our low temperature oxides suggest that they are close to stoichiometric thermal silicon dioxide. This is not surprising since silicon dioxide is the thermodynamically favored product of this pyrolytic reaction. Other low temperature deposition techniques such as plasma and photoenhanced CVD are far from thermal equilbrium. Hence the resulting dielectrics are often of the form SiO$_x$N$_y$, where x and y are strong functions of parameters such as plasma power, pressure, and gas ratios. This can be an advantage if dielectrics other than stoichiometric SiO$_2$ are preferred but would normally be a disadvantage for consistent high quality manufacture.

The etch rate is a sensitive measure of oxide quality, as well as being an important parameter in itself. It is related to properties such as mechanical strength, stress, resistivity, and field strength. Etch rates of oxides deposited per this invention ranged from 19 angstroms per second for 250 degrees C oxides to 40 angstroms per second for 120 degrees C oxides as compared to 3 angstroms per second for thermal oxides. These rates (relative to thermal oxides) are lower than plasma oxides deposited at similar temperatures. Samples were therefore annealed in nitrogen for 15 minutes at 300°-800° C. and measured for changes in thickness and etch rate.

The 250 degree oxides were thermally stable (no change in etch rate or thickness) for anneals of 300° to 400° C. The etch rate dropped to 5 angstroms per second for 800° C. anneal, and the thickness decreased by 3 percent. This suggests densification and a similar effect was observed for 120° C. oxide with changes beginning at anneal temperatures of 400° C.

The oxides made per this invention are uniform and have large field strengths that makes them suitable for device isolation and passivation. With gate oxide applications in mind, preliminary capacitance-voltage measurements have been made. These measurements have shown a fixed oxide charge density which compares favorably to other low temperature oxides. These results and other electrical properties of silicon dioxide made according to the process of this invention are reported in our paper *Low Temperature Pyrolytic Deposition of High Quality SiO$_2$*; Journal of Electrochemical Society: Solid-State Science and Technology, Vol. 134, No. 10, page 2517 which is hereby incorporated by reference into this application.

High quality, low temperature dielectrics are needed for many III-V devices, as well as some silicon applications. Much of the resarch is focused on silicon dioxide because it is well behaved and has the potential for good electrical and mechanical properties. Conventional low pressure CVD (0.5-1.0 torr) is not suitable for deposition of silicon dioxide below 450° C. The most common techniques for low temperature deposition are direct and indirect plasma-enhanced and photoenhanced CVD. These techniques involve systems that are far from thermal equilibrium and therefore often produce oxides that are much different from stoichiometric SiO$_2$ in composition and properties. According to the process disclosed in this invention, we have developed a low temperature pyrolytic process for SiO$_2$ deposition. By operating at pressures of 2-12 torr, we have achieved deposition of stoichiometric silicon dioxide in the 80°-330° C. range. High quality silicon dioxide was achieved over broad ranges of temperature, pressure, and oxygen to silane ratio. The technique of this invention is relatively straightforward; no radio frequency or ultraviolet sources or mercury vapors are needed. The resulting oxides have field strengths, resistivities, densities, and refractive indexes similar to thermal silicon dioxide grown in the 1000 ° to 1200° C. range. Because it is a CVD process, our silicon dioxide can be deposited on many substrates, including a variety of III-V compounds. This invention therefore facilitates the efficient manufacture of an expanded number of IC devices in both silicon and in III-V materials. Uniform and consistent dielectrics will provide both more reliable and more complex devices than those previously attained.

While the invention has been described with reference to the preferred embodiments thereof it should be understood by those skilled in the art that various changes in substance and form can be made therein without departing from the spirit and scope of the invention as detailed in appended claims. For example process is suitable for a variety of compound substrates not explicity recited in this application.

We claim:

1. A method of depositing silicon dioxide on a substrate comprising the steps of:
   placing the substrate in a reaction chamber;
   heating the substrate to between 80° C. and 330° C.;
   evacuating the reaction chamber containing the substrate to 2-12 torr; and subjecting the substrate to a non-excited gas flow mixture comprising silicon and oxygen bearing compounds in order to deposit a near-stoichiometric silicon dioxide layer upon said substrate.

2. The method of depositing silicon dioxide on a substrate of claim 1 wherein the silicon bearing compound is silane.

3. The method of depositing silicon dioxide on a substrate of claim 1 wherein the reaction chamber is evacuated to approximately 3 torr.

4. The method of depositing silicon dioxide on a substrate of claim 1 wherein the substrate comprises silicon.

5. The method of depositing silicon dioxide on a substrate of claim 1 wherein the substrate comprises indium phosphide.

6. The method of depositing silicon dioxide on a substrate of claim 1 wherein the substrate comprises gallium.

7. The method of depositing silicon dioxide on a substrate of claim 1 wherein the silicon bearing compound is selected from the group consisting of silane, disilane, silicon tetrachloride, hexachlorodisilane, tetraethoxysilane, tetramethylcyclotetrasiloxane and dichlorosilane.

8. The method of depositing silicon dioxide on a substrate of claim 1 wherein the oxygen bearing compound is selected from the group consisting of oxygen, nitrous oxide, nitric oxide, nitrogen dioxide, carbon dioxide and ozone.

9. The method of depositing silicon dioxide on a substrate of claim 1 wherein the silicon bearing compound comprises 3 percent silane in helium.

10. A method of depositing silicon dioxide on a substrate of claim 1 further comprising the step of subjecting the substrate and silicon dioxide layer to a low temperature heat treatment in order to densify the silicon dioxide layer.

11. A method of depositing silicon dioxide on a substrate comprising the step of:
placing the substrate in a reaction chamber;
heating the substrate to between 80° C. and 330° C.;
evacuating the reaction chamber containing the substrate to 2-12 torr; and
subjecting the substrate to a substantially non-excited gas flow mixture comprising silicon and oxygen bearing compounded in order to deposit by a strictly pyrolytic method, a near-stoichiometric silicon dioxide layer upon said substrate.

12. The method of depositing silicon dioxide on a substrate of claim 11 wherein the silicon bearing compound is selected from the group consisting of silane, disilane, silicon tetrachloride, hexachlorodisilane, tetraethoxysilane, tetramethyclcyclotetrasiloxane and dichlorosilane.

13. The method of depositing silicon dioxide on a substrate of claim 11 wherein the oxygen bearing compound is selected from the group consisting of oxygen, nitrous oxide, nitric oxide, nitrogen dioxide, carbon dioxide and ozone.

14. The method of depositing silicon dioxide on a substrate of claim 11 wherein the silicon bearing compound comprises 3 percent silane in helium.

15. The method of depositing silicon dioxide on a substrate of claim 11 further comprising the step of subjecting the substrate and silicon dioxide layer to a low temperature heat treatment in order to densify the silicon dioxide layer.

16. A method of depositing silicon dioxide on a substrate comprising the steps of:
placing the substrate in a reaction chamber;
heating the substrate to between 80° C. and 330° C.;
evacuating the reaction chamber containing the substrate to 2-12 torr; and
subjecting the substrate to a non-excited gas flow mixture comprising silicon and oxygen bearing compounds in order to deposit a near-stoichiometric silicon dioxide layer upon said substrate wherein the silicon bearing compound is selected from the group consisting of silane, disilane, silicon tetrachloride, hexachlorodisilane, tetraethoxysilane, tetramethylcyclotetrasiloxanne and dichlorosilane.

17. The method of depositing silicon dioxide on a substrate of claim 16 wherein the oxygen bearing compound is selected from the group consisting of oxygen, nitrous oxide, nitric oxide, nitrogen dioxide, carbon dioxide and ozone.

18. The method of depositing silicon dioxide on a substrate of claim 16 wherein the substrate comprises silicon.

19. The method of depositing silicon dioxide on a substrate of claim 16 wherein the substrate comprises indium phosphide.

20. The method of depositing silicon dioxide on a substrate of claim 16 wherein the substrate comprises gallium.1

* * * * *

UNITED STATES PATENT AND TRADEMARK OFFICE
CERTIFICATE OF CORRECTION

PATENT NO. : 4,900,591
DATED : February 13, 1990
INVENTOR(S) : Brian R. Bennett et al.

It is certified that error appears in the above-identified patent and that said Letters Patent is hereby corrected as shown below:

In col. 6, line 68, the word "os" should read -- of --.

In col. 7, line 18, the word "water" should read -- wafer --.

In col. 9, lines 17 and 18, the word "gallium" should read -- gallium arsenide --.

In col. 9, line 47, the word "compounded" should read -- compounds --.

In col. 10, line 48, the word "gallium.1" should read -- gallium arsenide --.

Signed and Sealed this

Twenty-fifth Day of February, 1992

Attest:

HARRY F. MANBECK, JR.

*Attesting Officer*     *Commissioner of Patents and Trademarks*